(12) United States Patent
Oh (10) Patent No.: US 11,313,604 B2
(45) Date of Patent: Apr. 26, 2022

(54) TEMPERATURE CONTROLLED CONTAINER

(71) Applicant: LG ELECTRONICS INC., Seoul (KR)

(72) Inventor: Minkyu Oh, Seoul (KR)

(73) Assignee: LG Electronics Inc., Seoul (KR)

( * ) Notice: Subject to any disclaimer, the term of this patent is extended or adjusted under 35 U.S.C. 154(b) by 354 days.

(21) Appl. No.: 16/201,350

(22) Filed: Nov. 27, 2018

(65) Prior Publication Data

US 2019/0162460 A1 May 30, 2019

(30) Foreign Application Priority Data

Nov. 29, 2017 (KR) .......................... 10-2017-0161641

(51) Int. Cl.
*F25D 3/00* (2006.01)
*F25B 21/02* (2006.01)
(Continued)

(52) U.S. Cl.
CPC .............. *F25D 3/005* (2013.01); *F25B 21/02* (2013.01); *F25D 11/003* (2013.01); *F25D 16/00* (2013.01);
(Continued)

(58) Field of Classification Search
CPC ........ F25D 3/005; F25D 11/003; F25D 16/00; F25D 11/006; F25D 2700/121;
(Continued)

(56) References Cited

U.S. PATENT DOCUMENTS 3,821,881 A 7/1974 Harkias
5,522,216 A 6/1996 Park et al.
(Continued)

FOREIGN PATENT DOCUMENTS

CN 1172934 A 2/1998
CN 1623665 A 6/2005
(Continued)

OTHER PUBLICATIONS

Search Report of European Patent Office in Appl'n No. 20169413.0, dated Aug. 14, 2019.
(Continued)

*Primary Examiner* — Brian M King
(74) *Attorney, Agent, or Firm* — Dentons US LLP (57) ABSTRACT

A temperature controlled container includes a case which has a storage space formed therein; a thermoelectric element; a heat transfer body in communication with the thermoelectric element and facing the storage space. The heat transfer body includes a heat transfer case which has an enclosed space formed therein and is wider than the thermoelectric element, and includes a portion facing the thermoelectric element; a phase change material which is accommodated in the enclosed space; and a heat transfer body which is disposed in the heat transfer case so as to be positioned in the enclosed space. The heat transfer body has a first body portion which is in communication with the portion of the heat transfer case facing the thermoelectric element and a second body portion, and the first body portion in communication with the second body portion.

17 Claims, 6 Drawing Sheets

(51) Int. Cl.
*H01L 35/28* (2006.01)
*F25D 11/00* (2006.01)
*F25D 16/00* (2006.01)

(52) U.S. Cl.
CPC ........ *H01L 35/28* (2013.01); *F25B 2321/023* (2013.01); *F25B 2321/0211* (2013.01); *F25B 2321/0212* (2013.01); *F25B 2321/0251* (2013.01); *F25D 11/006* (2013.01); *F25D 2700/121* (2013.01)

(58) Field of Classification Search
CPC .... F25B 21/02; F25B 2321/025; F25B 21/00; F25B 2321/0211; F25B 2321/0212; F25B 2321/023; F25B 2321/0251
See application file for complete search history.

(56) References Cited

U.S. PATENT DOCUMENTS

| | | | |
|---|---|---|---|
| 5,771,788 A | 6/1998 | Lee et al. | |
| 8,807,814 B1* | 8/2014 | Glenn | F21V 33/0096 362/580 |
| 8,961,152 B2* | 2/2015 | Wark | F04D 29/601 417/423.15 |
| 2002/0162339 A1 | 11/2002 | Harrison et al. | |
| 2004/0068992 A1* | 4/2004 | Cauchy | F25B 21/02 62/3.61 |
| 2005/0086947 A1 | 4/2005 | Minoura | |
| 2008/0282705 A1 | 11/2008 | Hue et al. | |
| 2013/0145988 A1* | 6/2013 | DeDontney | F25B 21/02 118/724 |
| 2015/0159924 A1* | 6/2015 | Calderon | F25D 11/006 62/3.6 |
| 2016/0243000 A1* | 8/2016 | Gray | F25D 3/08 |
| 2017/0115039 A1* | 4/2017 | St. Rock | H05K 7/20136 |
| 2017/0219256 A1* | 8/2017 | Friend | F25B 21/02 |
| 2017/0299238 A1* | 10/2017 | Hepp | F25B 29/00 |

FOREIGN PATENT DOCUMENTS

| | | |
|---|---|---|
| CN | 101160497 A | 4/2008 |
| FR | 2853400 A1 | 10/2004 |
| JP | 2001208465 A | 8/2001 |
| KR | 1020050039578 A | 4/2005 |
| KR | 1020070025801 A | 3/2007 |
| KR | 1020070106028 A | 10/2007 |
| KR | 10-2014-0073137 A | 6/2014 |
| WO | 9519533 A1 | 7/1995 |
| WO | 2006-088413 A1 | 8/2006 |
| WO | 2007-000208 A1 | 1/2007 |

OTHER PUBLICATIONS

Office Action of Chinese Patent Office in Appl'n No. 201811444465.0, dated Jul. 2, 2020.

"Introduction to Energy Storage Technology, Textbook for University Education '135' Plan", China University of Mining and Technology textbook layout project financial support textbook, Joongho Roh, edited by Wang Shuangfeng, China University of Mining and Technology Press, Jan. 1, 2017.

* cited by examiner

TEMPERATURE CONTROLLED CONTAINER

The present application claims priority under 35 U.S.C. 119 and 35 U.S.C. 365 to Korean Patent Application No. 10-2017-0161641 (filed on Nov. 29, 2017), which is hereby incorporated by reference in its entirety.

BACKGROUND

The present application relates to a temperature controlled container, and more particularly, to a temperature controlled container capable of keeping food and the like warm or cold using a phase change material and a thermoelectric element.

A temperature controlled container stores and keeps the object to be controlled in warm or cold temperature.

Various structures that minimize a temperature change of a space in which an object to be controlled (hereinafter, referred to as object) is stored can be applied to such a temperature controlled container. For example, it is possible to form a vacuum between an inner container in which a storage space is formed and an outer container which is spaced apart from the inner container. It is also possible to cover an outer surface of the inner container in which the storage space is formed with a heat insulating material.

In the temperature controlled container, the temperature of the object changes with time, and the time for substantially maintaining the temperature may be short.

To maintain the temperature longer, the temperature controlled container may use a thermoelectric element. In the Korean Utility Model Publication No. 20-0251824 Y1 (published on Nov. 22, 2001), a refrigerating container is disclosed which uses a thermoelectric element to refrigerate drinking water as an object at an appropriate temperature.

The refrigerating container discloses a casing which is divided into a first accommodation space and a second accommodation space by an internal diaphragm. A thermoelectric element is mounted in the second accommodation space of the casing and is made of a semiconductor whose energy level element is converted according to electrical characteristics. A heat accumulation member accumulates the cool air generated by the thermoelectric element and provides the cool air to an upper half portion of the casing including the diaphragm. A drinking water accommodation box which has a double wall filled with a coolant is detachable in the first accommodation space, and has a space for accommodating the drinking water. A guide pipe passes through the diaphragm and guides the drinking water discharged from the drinking water accommodation box. A cock is connected to the guide pipe to discharge the drinking water to the outside.

In the temperature controlled container according to the related art, in a case where the size of the drinking water accommodation box having the double wall filled with the coolant is larger than that of the heat transfer element, there are problems in that it can take a long time for heat or cool air to be uniformly transferred to the entire coolant and the temperature variation inside the drinking water accommodation box becomes large while the temperature of the entire coolant filled in the double wall is becoming uniform.

SUMMARY

One objective is to provide a temperature controlled container which minimizes temperature imbalance within a storage space.

An embodiment of the present invention includes a case including a storage space formed therein; a thermoelectric element; a first heat transfer body in communication with the thermoelectric element and facing the storage space; the first heat transfer body including a heat transfer case including an enclosed space formed therein and is wider than the thermoelectric element, the heat transfer case including a first portion facing the thermoelectric element; a phase change material accommodated in the enclosed space; and a heat transfer body disposed in the heat transfer case so as to be positioned in the enclosed space. The first heat transfer body includes a first body portion in communication with the portion of the heat transfer case facing the thermoelectric element and a second body portion, and the first body portion is in communication with the second body portion.

A plurality of the heat transfer bodies may be disposed radially in the enclosed space beginning from a center of the enclosed space and extending to ends of the enclosed space of the heat transfer case.

A second heat transfer body may be provided including a contact plate in communication with the thermoelectric element, and one or more fins in communication with the contact plate.

The heat transfer case may include an upper body including an upper surface facing the storage space, a lower body including the first portion facing the thermoelectric element and the second portion that does not face the thermoelectric element, and a connection body that connects the lower body and the upper body, and the heat transfer body including the second body portion including a connection end that is connected to the connection body.

The heat transfer body may be a wall including a length extending from a center of the heat transfer case to the connection body and including a height extending from the lower body to the upper body.

The case may include an outer case and an inner case disposed in the outer case and includes the storage space therein.

The inner case may be provided with a stopper that restricts the heat transfer case from moving in an upward direction beyond the stopper.

The inner case may have a contact surface with which the heat transfer case is in surface contact.

The temperature controlled container includes a cap that opens and closes the storage space; a flow path body disposed in the case and partitions the storage space into an inner path on an inner side and an outer path on the outer side thereof; a circulation fan cover disposed in the flow path body and including an inner through-hole through which air passes; and a circulation fan disposed between the circulation fan cover and the heat transfer case.

The first heat transfer body may further include at least one outer fin formed on an upper surface of the heat transfer case and performs heat exchange with flowing air caused by the circulation fan.

The outer fin may protrude from the upper surface of the heat transfer case toward the circulation fan.

The flow path body may be in contact with the outer fin.

The flow path body may be a hollow cylinder with an upper end spaced apart from the cap and a lower end spaced apart from the heat transfer case.

The circulation fan cover may be disposed in the flow path body so as to be spaced apart from the outer fin.

The temperature controlled container may further include an air guide disposed on an upper portion of the heat transfer case so as to surround the outer fin.

The air guide may include an outer through-hole facing the outer path.

The air guide may include an outer air guide disposed so as to protrude in a hollow shape at the upper portion of the heat transfer case and includes a space therein; and an upper air guide formed on an upper portion of the outer air guide and in which the outer through-hole is formed.

The air guide may have a flow path body insertion hole into which a lower portion of the flow path body is inserted.

The outer through-hole may be formed outside the flow path body insertion hole.

The circulation fan cover may be disposed in the flow path body so as to be spaced apart from the heat transfer case.

The inner case of the case may be provided with a stopper that restricts air guide from moving in the upward direction beyond the stopper and a contact surface in which the air guide is in surface contact.

The temperature controlled container includes a removal base including a battery; a fan cover disposed on the base, and a fan disposed in the fan cover and blows air to the second heat transfer body, and the fan cover may include an outer cover that surrounds the circumference of the fan, and a lower cover formed under the outer cover and is positioned under the fan. Each of the outer cover and the lower cover may have a through-hole through which the air passes.

According to the embodiment of the present invention, the entire first heat transfer body may be quickly heated or cooled, and there is an advantage that the temperature of the object may be adjusted in a state where the temperature scattering of the first heat transfer body is uniform.

In addition, there are advantages that the heat transfer body supports the upper body so that the upper body may be supported without being bent or drooped toward the enclosed space, and breakage or damage of the first heat transfer body may be minimized.

In addition, there is an advantage that the heat transfer body may transfer heat quickly in both the vertical direction and the horizontal direction, respectively.

In addition, the flow path body and the circulation fan form a circulating air flow in the storage space, and the temperature of the object in the storage space may be more quickly adjusted.

In addition, the outer fin formed in the first heat transfer body may quickly heat-exchange the first heat transfer body and the storage space, and the inside of the storage space may be managed at the desired temperature more quickly.

DETAILED DESCRIPTION OF THE EMBODIMENTS

Hereinafter, preferred embodiments of the present invention will be described in detail with reference to the accompanying drawings. Meanwhile, a configuration and a control method of the apparatus described below are only for explaining the embodiments of the present invention and are not intended to limit the scope of the present invention, and the same reference numbers may be used throughout the specification to represent the same components.

Figure 1:
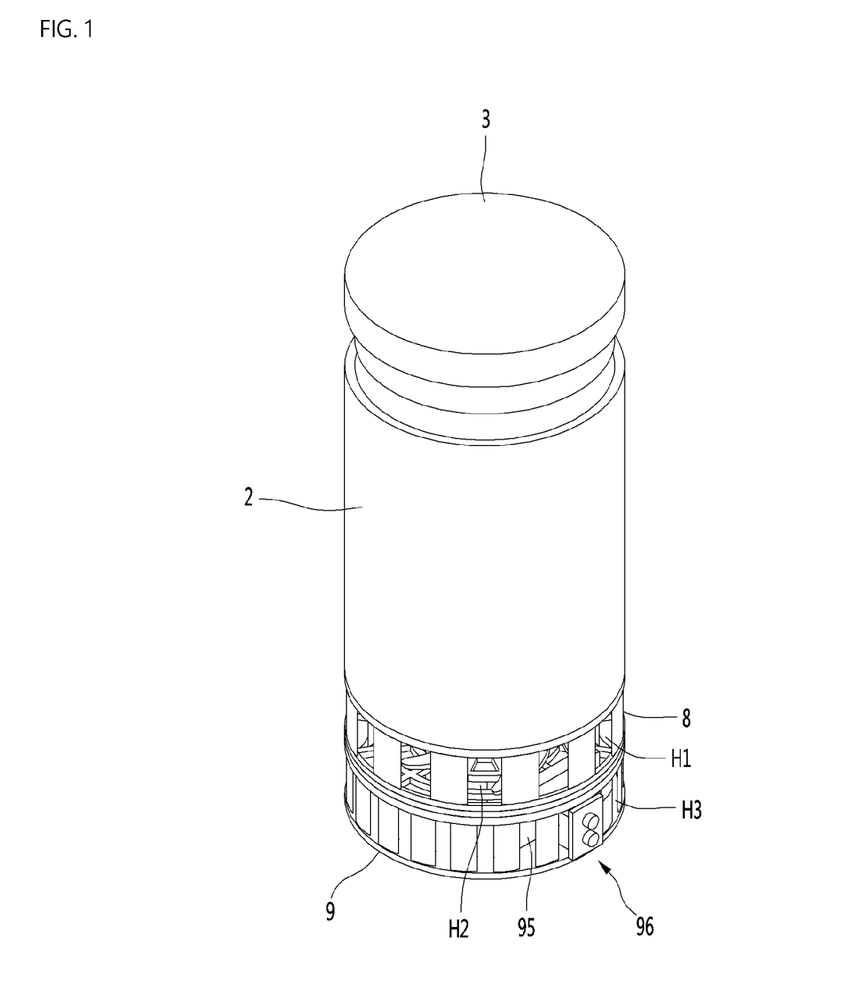
FIG. 1 is a perspective view illustrating a temperature controlled container according to an embodiment of the present invention.
Figure 2:
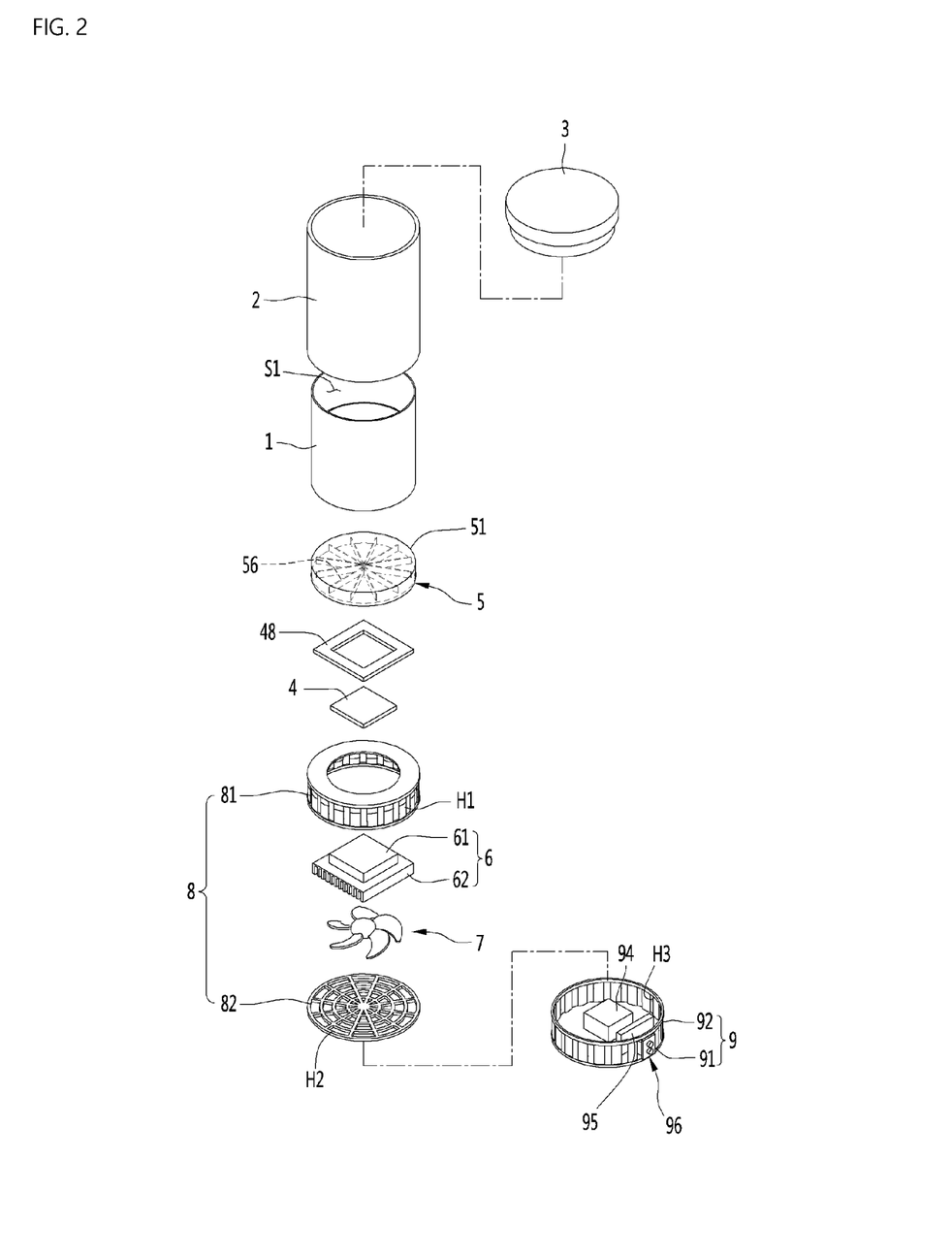
FIG. 2 is an exploded perspective view illustrating the temperature controlled container according to an embodiment of the present invention.
Figure 3:
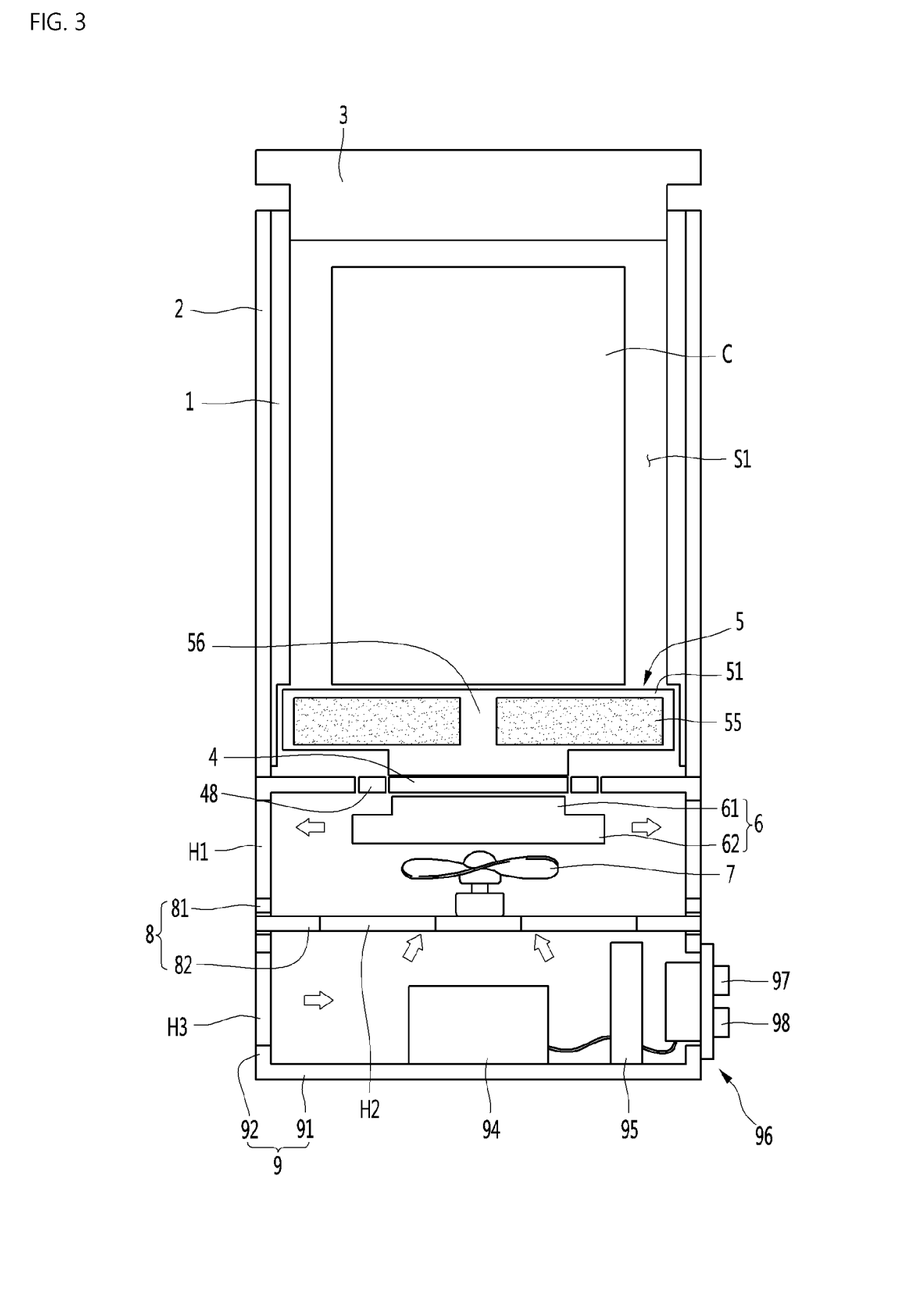
FIG. 3 is a longitudinal-sectional view illustrating the temperature controlled container according to an embodiment of the present invention.

FIG. 1 is a perspective view illustrating a temperature controlled container according to an embodiment of the present invention; FIG. 2 is an exploded perspective view illustrating the temperature controlled container according to an embodiment of the present invention; and FIG. 3 is a longitudinal-sectional view illustrating the temperature controlled container according to an embodiment of the present invention.

The temperature controlled container may include cases 1 and 2, a thermoelectric element 4, a first heat transfer body 5, and a second heat transfer body 6.

In the cases 1 and 2, a storage space S1 may be formed in which an object to be kept warm or cold is accommodated and stored.

Here, the object to be stored in the storage space S1 may be a liquid container in which liquid such as water or beer is contained, food such as fruit or meat, liquefied drink, and like. It is needless to say that the object is not limited to this type as long as it can be accommodated in the storage space S1. Hereinafter, the object accommodated in the storage space S1 will be referred to as the object C and will be so described.

The temperature controlled container may store the object C while cooling or heating the object C using a thermoelectric element 4.

The temperature controlled container may be a refrigerating container which stores and cools the object C using the thermoelectric element 4. The temperature controlled container may be a heating container which stores and heats the object C using the thermoelectric element 4. The temperature controlled container may be container using a thermoelectric element 4 as a heat pump that selectively cools and heats the object C.

The cases 1 and 2 may include a heat transfer member which transfer heats and a heat insulating member which insulates the heat transfer member. The heat transfer member may be disposed inside the heat insulating member.

The cases 1 and 2 preferably comprise multiple structures and may include an inner case 1 formed of a material having high heat transfer property and an outer case 2 formed of a material having high thermal insulation property. The storage space S1 may be formed inside the inner case 1.

The inner case 1 may be a case which has a higher heat transfer rate than the outer case 2.

The inner case 1 may be formed of a material such as steel and may be a hollow cylindrical shape and a storage space S1 may be formed therein. The upper and lower surfaces of the inner case 1 may be opened.

The outer case 2 may be formed of a synthetic resin such as acrylonitrile butadiene styrene (ABS) or a combination of a synthetic resin such as ABS and a heat insulating material. The outer case 2 may be formed larger than the inner case 1. The outer case 2 may surround the outer circumferential surface of the inner case 1. The outer case 2, like the inner case 1, may be a hollow cylindrical shape.

The temperature controlled container may further include a cap 3 which opens and closes the storage space S1. The cap 3 may close an opening of the case 1 and 2 to cover the storage space S1 and may open from the cases 1 and 2 to have access to the storage space S1.

A thermoelectric element (TEM) 4 uses endothermic action or exothermic action by Peltier effect which utilizes a phenomenon in which a temperature difference occurs on both end surfaces of different metals when different metals are combined and a current flows through them.

The thermoelectric element 4 may be disposed between the first heat transfer body 5 and the second heat transfer body 6. The first heat transfer body 5 may come in contact with one surface of the thermoelectric element 4 and the second heat transfer body 6 may come in contact with the other surface of the thermoelectric element 4.

The first heat transfer body 5 may be disposed on the upper portion of the thermoelectric element 4 and the thermoelectric element 4 may be disposed on the upper portion of the second heat transfer body 6.

The thermoelectric element 4 may include a cold side and a hot side and a temperature difference between the low temperature portion and the high temperature portion may be determined according to a voltage applied to the thermoelectric element 4.

During the cooling operation of the temperature controlled container, when the high temperature portion is about 35 degrees, the low temperature portion may be 5 degrees, and a low temperature may be maintained at about 12 degrees suitable for keeping the cold by adjusting the applied voltage.

During the heating operation of the temperature controlled container, when the low temperature portion is about 15 degrees, the high temperature portion may be 70 degrees, and the high temperature may be maintained at about 55 degrees suitable for keeping the warmth by adjusting the applied voltage.

The thermoelectric element 4 may absorb the heat of the first heat transfer body 5 and transfer the heat to the second heat transfer body 6 or absorb the heat of the second heat transfer body 6 to transfer the heat to the first heat transfer body 5.

In other words, when the first heat transfer body 5 acts as a heat sink, the second heat transfer body 6 act as a cooling plate and, conversely, when the second heat transfer body 6 acts as a heat sink, the first heat transfer body 5 act as a cooling plate.

The low temperature portion and the high temperature portion of the thermoelectric element 4 can be swapped between them according to the direction of the applied current.

The upper surface of the thermoelectric element 4 may be a first heat transfer surface in contact with the first heat transfer body 5 and the lower surface of the thermoelectric element 4 may be a second heat transfer surface in contact with the second heat transfer body 6.

When the first heat transfer surface is a high temperature portion, the second heat transfer surface may be a low temperature portion, and conversely, when the first heat transfer surface is a low temperature portion, the second heat transfer surface may be a high temperature portion.

The thermoelectric element 4 may absorb the heat of the first heat transfer body 5 and transfer the heat to the second heat transfer body 6, and, in this case, the first heat transfer body 5 may be a cooling plate which absorbs the heat of the storage space S1 or the object C to cool the object C. As described above, in a case where the first heat transfer body 5 is a cooling plate, the second heat transfer body 6 may be a heat sink which absorbs the heat of the thermoelectric element 4 and radiates heat to the outside of the storage space S1.

Conversely, The thermoelectric element 4 may absorb the heat of the second heat transfer body 6 and transfer the heat to the first heat transfer body 5. In this case, the first heat transfer body 5 may be a heat sink which radiates the heat to the storage space S1 or the object C to increase the temperature of the object C. As described above, in a case where the first heat transfer body 5 is a heat sink, the second heat transfer body 6 may be a cooling plate which absorbs the heat outside of the storage space S1.

The temperature controlled container may further include a heat insulating material 48 surrounding an outer circumference of the thermoelectric element 4.

The first heat transfer body 5 directly heats or cools the storage space S1 or the object C. The first heat transfer body 5 may heat the storage space S1 or the object C for a long time by storing the heat of the thermoelectric element 4, and conversely may cool the storage space S1 or the object C for a long time by storing the coldness of the thermoelectric element 4.

The second heat transfer body 6 may include a contact plate 61 which is in contact with the thermoelectric element 4. The second heat transfer body 6 may further include one or fins 62 protruding from the contact plate 61 in a direction away from the thermoelectric element 4.

The temperature controlled container may further include a fan 7 which blows air to the second heat transfer body 6.

The temperature controlled container may further include a fan cover 8 which protects the fan 7. The fan cover 8 may include an outer cover 81 which surrounds the outer circumference of the fan 7, and a lower cover 82 which is disposed below the outer cover 81 and is positioned under the fan cover 7.

Through-holes H1 and H2 through which air may pass may be formed in the outer cover 81 and the lower cover 82, respectively.

Meanwhile, the temperature controlled container may further include a base 9.

The base 9 may have a three-dimensional shape in which a space is formed therein. The base 9 may include a lower plate 91 and an upper base 92 which is formed on the upper portion of the lower plate 91. The upper base 92 may have a hollow cylindrical shape in which the space is formed therein. The upper base 92 may be provided with a through-hole H3 through which air may pass. The overall shape of the upper base 92 may be a grill shape and may have a plurality of through-holes H3.

The fan cover 8 may be disposed above the base 9 and the load of the temperature controlled container may be applied to the base 9. The base 9 may be detachably coupled to the fan cover 8 by a restricting structure such as a hook.

In one example, the fan 7 may be positioned below the second heat transfer body 6 and may be an axial fan which blows air upward. In this case, the through-holes H3 of the base 9 may act as suction holes which suck air outside the temperature controlled container, and the one or more through-holes H2 of the lower cover 82 may act as communication holes which suck the air sucked into the base 9 into the inside of the fan cover 8. The one or more through-holes H1 of the outer cover 81 may act as discharge holes through which the air performing heat exchange with the second heat transfer body 6 after being blown by the fan 7 is discharged to the outside of the temperature controlled container.

In another example, the fan 7 may be positioned under the second heat transfer body 6 and may be an axial fan which blows air downward. In this case, the one or more through-holes H1 of the outer cover 81 may act as suction holes which suck air outside the temperature controlled container, and the one or more through-holes H2 of the lower cover 82 may act as communication holes to which the air performing heat exchange with the second heat transfer body 6 is blown into the inside of the base 9. The one or more through-holes H2 of the lower cover 82 may act as discharge holes to which the air is blown into the base 9 may be discharged to the outside of the temperature controlled container.

It should be noted that depending on how the control module 95 (see FIG. 3) controls the fan, depending on the rotational directional direction of the fan 7, the air may be blown upward or downward.

The temperature controlled container may further include a rechargeable battery 94. The rechargeable battery 94 may be disposed in the base 9. The rechargeable battery 94 may be positioned in the space formed in the upper base 92. The temperature controlled container is provided with a rechargeable battery 94 so that the temperature controlled container may be portable for a predetermined period of time.

Meanwhile, the temperature controlled container may further include a control module 95 which controls the thermoelectric element 4 and the fan 7. The control module may be an electric circuit or the like. The control module 95 may be disposed in the base 9. The control module 95 may be positioned in the space formed inside the upper base 92.

The temperature controlled container may further include a controller 96 which controls an operation mode, the desired temperature, and the like of the temperature controlled container. The controller 96 may include a cold and hot selection switch 97 which selects a cooling mode and a heating mode. The controller 96 may further include a temperature adjustment dial 98 which can be adjusted to a desired temperature.

The controller 96 may be disposed on the base 9.

Meanwhile, the base 9, the rechargeable battery 94, the control module 95, and the controller 96 can be a base module when assembled. In addition, among the configuration of the temperature controlled container, the remaining configurations except for the base module may be a thermal insulation module which keeps the object C warm or cold.

The base module may be detachably coupled to the fan cover 8. The base module having the rechargeable battery 84 may be charged while being separated from the thermal insulation module. The user may simply charge the temperature controlled container with only the base module, and thereby the entire temperature controlled container is not needed in order to charge the temperature controlled container.

Figure 4:
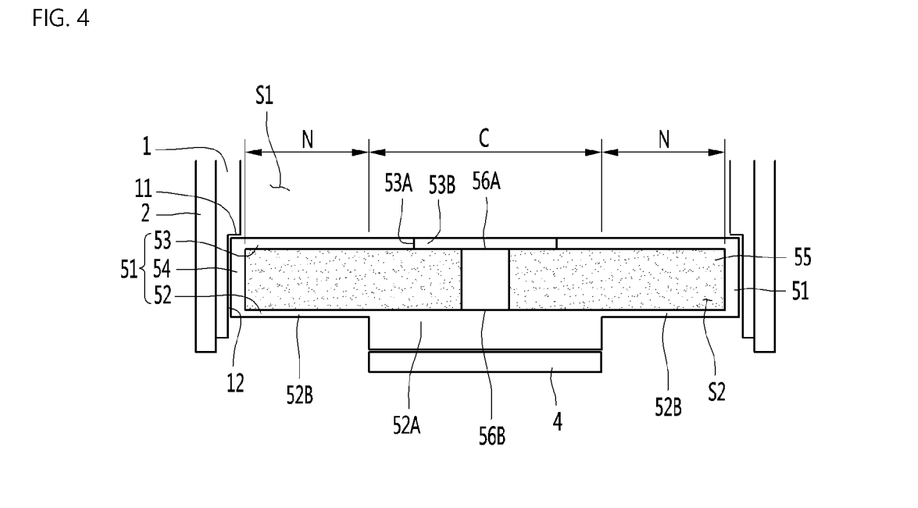
FIG. 4 is an enlarged longitudinal-sectional view illustrating a case, a first heat transfer body, and a thermoelectric element according to an embodiment of the present invention.
Figure 5:
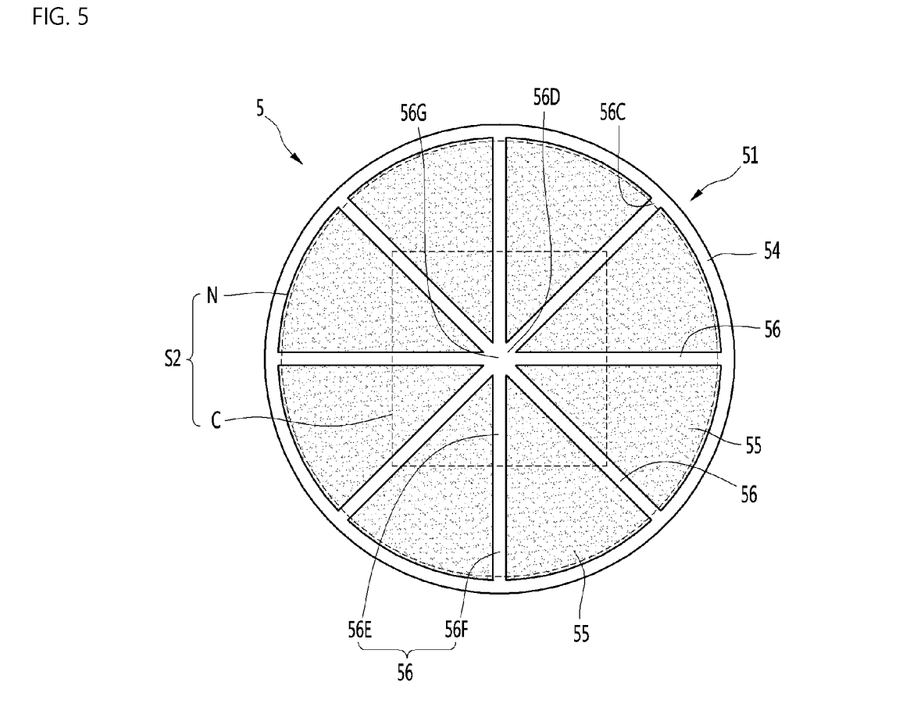
FIG. 5 is a cross-sectional view illustrating an inside of the first heat transfer body according to an embodiment of the present invention.

FIG. 4 is an enlarged longitudinal sectional view illustrating a case, a first heat transfer body, and a thermoelectric element according to an embodiment of the present invention, and FIG. 5 is a cross-sectional view illustrating the inside of the first heat transfer body according to an embodiment of the present invention.

With reference to FIG. 4, the inner case 1 may be provided with a stopper 11 which restricts the upper end of a heat transfer case 51 from moving upward beyond the stopper 11. The stopper 11 may be formed on an inner circumferential surface of the inner case 1. The stopper 11 may be in surface contact with an upper edge of the heat transfer case 51.

The inner case 1 may be provided with a contact surface 12 with which the heat transfer case 51 is in contact with the inner case 1. The contact surface 12 may be formed on the inner circumferential surface of the inner case 1. The contact surface 12 may be in surface contact with an outer circumferential surface of the heat transfer case 51.

When the first heat transfer body 5 and the inner case 1 are assembled, the first heat transfer body 5 may be inserted into the inner case 1.

The stopper 11 and the contact surface 12 may be formed at the lower portion of the inner case 1, and the heat transfer case 51 may be coupled to the inner case 1 by being inserted into the inner case 1 from the bottom of the inner case 1.

The heat transfer case 51 may be restricted by the stopper 11 from further moving upward such that the heat transfer case 51 is in surface contact with the stopper 11 and the contact surface 12.

An upper surface of the heat transfer case 51 may form a storage space S1 together with the inner circumferential surface of the inner case 1. When the heat transfer case 51 is assembled to the inner case 1, the assembly of the heat transfer case 51 and the inner case 1 may constitute a container having an opened top surface such as a cup.

The first heat transfer body 5 and the inner case 1 may constitute a direct cooling type cooling container for directly cooling the storage space S1 or a direct heating type heating container for directly heating the storage space S1.

An enclosed space S2 in which a phase change material 55 and a heat transfer body 56 (see FIG. 5) to be described later are accommodated may be formed in the heat transfer case 51.

The first heat transfer body 5 may include a heat transfer case 51 having a closed space S2 formed therein and being larger than the thermoelectric element 4; a phase change material 55 accommodated in the enclosed space S2; and a heat transfer body 56 formed inside the heat transfer case 51 so as to be positioned in the enclosed space S2.

As illustrated in FIG. 4, the heat transfer case 51 may include a lower body 52; an upper body 53; and a connection body 54.

The lower surface of the lower body 52 faces the thermoelectric element 4. The lower surface of the lower body 52 may be the lower surface of the first heat transfer body 5.

The upper surface of the upper body 53 faces the storage space S1. The upper surface of the upper body 53 may be the upper surface of the first heat transfer body 5.

The upper body 53 may be positioned on the upper side of the lower body 52 and the upper body 53 and the lower body 52 may be spaced apart in the up and down direction.

The connection body 54 connects the lower body 52 and the upper body 53 with each other. The connection body 54 maintains a spacing between the lower body 52 and the upper body 53. An outer circumferential surface of the connection body 54 may be the outer circumferential surface of the first heat transfer body 5.

The upper body 53 may be restricted by the stopper 11 in a state where the upper body 53 is in surface contact with the stopper 11 when the first heat transfer body 5, the inner case 1, and the thermoelectric element 4 are assembled. The connection body 54 can be in surface contact with the contact surface 12 of the inner case 1.

The first heat transfer body 5 may perform heat exchange with the inner case 1 through the upper body 53 and the connection body 54. The upper body 53 and the connection body 54 may be a portion of the first heat transfer body 5 which is actually in contact with the inner case 1 of the first heat transfer body 5. The upper body 53 may be a heat transfer portion which transfers heat between the storage space S1 and the phase change material 55, and the connection body 54 may be a heat transfer portion which transfers heat between the inner case 1 and the phase change material 55.

The enclosed space S2 may be formed by the lower body 52, the connection body 54 and the upper body 53 and the phase change material 55 may be filled and accommodated in the enclosed space S2.

According to this embodiment, each of the lower body 52 and the upper body 53 may have a disk shape.

The connection body 54 may be a hollow cylindrical shape. The connection body 54 may have a hollow cylindrical shape or a ring shape corresponding to the lower body 52 and the upper body 53.

The heat transfer case 51 may be a disk or a cylindrical shape having a closed space S2 formed therein.

The phase change material 55 may be a heat storage material or a cold storage material or heat/cold storage material which is injected or placed into the enclosed space S2 to store heat or cold in the inside of the heat transfer case 51.

The first heat transfer body 5 may include a contact body portion 52A which is in contact with the thermoelectric element 4. The first heat transfer body 5 has a non-contact body portion 52B which is not in contact with the thermoelectric element 4.

The contact body portion 52A is positioned on the upper side of the thermoelectric element 4 and faces the thermoelectric element 4 in the up and down direction.

The lower surface of the contact body portion 52A may be in direct surface contact with the upper surface of the thermoelectric element 4 or may be in contact with the upper surface of the thermoelectric element 4 through a separate heat transfer pad, an adhesive, or the like which is positioned between the lower surface of the contact body portion 52A and the upper surface of the thermoelectric element 4.

The contact body portion 52A and the non-contact body portion 52B may be formed in the lower body 52 of the first heat transfer body 5.

The lower body 52 has a contact body portion 52A which faces the thermoelectric element 4 and is in contact with the thermoelectric element 4, and a non-contact body portion 52B which is not in contact with the thermoelectric element 4 and does not face the thermoelectric element 4.

The lower body 52 may extend from the contact body portion 52A to the non-contact body portion 52B.

The enclosed space S2 may be divided into two regions C and N depending on whether or not the enclosed space faces the contact body portion 52A.

That is, the enclosed space S2 may be divided into a first region C which faces the contact body portion 52A and a second region N which faces the non-contact body portion 52B.

The first region C is a region positioned above the contact body portion 52A in the enclosed space S2 and may be a region which faces the contact body portion 52A in the up and down direction.

The second region N is a region positioned above the non-contact body portion 52A in the enclosed space S2 and may be a region which faces the non-contact body portion 52B in the up and down direction.

The contact body portion 52A may be a portion that transmits heat between the thermoelectric element 4 and the first region C.

The contact body portion 52A of the lower body 52 may be the same size and outer shape as the thermoelectric element 4. The first region C is a region which faces the contact body portion 52A of the enclosed space S2, and the first region C may have the same region and shape as the thermoelectric element 4.

In a case where the thermoelectric element 4 is a polygonal shape such as a quadrangle, the contact body portion 52A, and the first region C may have a polygonal shape like the thermoelectric element 4.

The second region N may be a region which surrounds the outer circumference of the first region C and a region of a closed loop cross-sectional shape in which a polygonal hole is formed at the center.

The first region C may be a region which faces the thermoelectric element 4 in the up and down direction in the enclosed space S2. The second region N may be a region which does not face the thermoelectric elements 4 in the up and down direction of the enclosed space S2.

A heat transfer body 56 may extend from the first region C to the second region N. The first region C is a region which is on and/or relatively close to the thermoelectric element 4 and the first region C may be heated or cooled earlier than the second region N. The second region N may be a region which is heated or cooled relatively later than the first region C.

The heat transfer body 56 promotes heat transfer between the first region C and the second region N and may be an elongated body extending from the first region C to the second region N.

The heat transfer body 56 may be in the form of a wall having a long length extending in the horizontal direction and erected vertically between the upper body 53 and the lower body 52.

The heat transfer body 56 may be a heat transfer fin which promote the heat transfer of the phase change material 55 filled in the heat transfer case 51 between the first region C and the second region N. The heat transfer body 56 may be an inner fin disposed in the heat transfer heating case 51.

The heat transfer body 56 may can help perform heat-transfer between the lower body 52 and the upper body 53. The lower end 56B of the heat transfer body 56 may be connected to the lower body 52 and the upper end 56A thereof may be connected to the upper body 53. The heat transfer body 56 may promote the heat transfer between the lower body 52 and the upper body 53 and the lower body 52 and the upper body 53 may perform heat exchange with the connection body 54, the phase change material 55, and the heat transfer body 56, respectively.

The heat transfer body 56 may have a connection end 56C (see FIG. 5) that connects to the connection body 54.

The heat transfer body 56 may have one end 56D which is positioned to be on and/or close to the contact body portion 52A in the longitudinal direction. The connection end 56C may be the other end of the heat transfer body 56 which is connected to the connection body 54.

The heat transfer body 56 may include a first body portion 56E and a second body portion 56F sequentially positioned in the longitudinal direction thereof.

The first body portion 56E may be a portion of the heat transfer body 56 on and/or adjacent to the contact body 52A and the thermoelectric element 4 in the up and down direction and adjacent to the contact body 52A.

The second body portion 56F may be a portion between the first body portion 56E and the connection body 54.

The first body portion 56E may be defined as a portion of the heat transfer body 56 positioned on the upper side of the contact body 52A. The second body portion 56F may be defined as a portion positioned on the upper side of the non-contact body 52B of the heat transfer body 56.

A plurality of heat transfer bodies 56 may be provided in the enclosed space S2 and the plurality of heat transfer bodies 56 may be radially disposed in the enclosed space S2.

The heat transfer body 56 may partition the enclosed space S2 into a plurality of unit spaces, and the phase change material 55 may be accommodated in each of the plurality of unit spaces.

A center core 56G to which the plurality of heat transfer bodies 56 are connected may be formed at an inner center of the heat transfer case 51.

The phase change material 55 may be dispersed and accommodated in the plurality of unit spaces and the phase change material 55 filled in a unit space may be blocked between two heat transfer bodies 56 and cannot move to the other unit space which is positioned in the vicinity thereof.

The phase change material 55 may be distributed in a plurality of unit spaces and be uniformly filled in the plurality of unit spaces without being concentrated on a specific unit space, and thus the entire heat transfer case 51 may be uniformly heated or cooled.

The heat transfer body 56 promotes the heat transfer between the lower body 52 and the upper body 53, and the connection body 54, which constitutes the heat transfer case 51, and the heat transfer between the phase change material positioned in the first region C and the phase change material positioned in the second region N may be promoted, and the entire temperature of the first heat transfer body 5 may be quickly equalized.

The upper surface of the first heat transfer body 5 may be divided into a region which is relatively close to the thermoelectric element 4 and a region which is not relatively close to the thermoelectric element 4, and since the temperature dispersion of the entire first heat transfer body 5 is not large, the temperature of the upper surface of the first heat transfer body 5 may be uniform as a whole, and thus the temperature of the storage space S1 may be uniform as a whole.

Meanwhile, when the heat transfer case 51 is manufactured, any one of the lower body 52 and the upper body 53 may be provided with a phase change material inlet 53A for filling the phase change material 55 into an enclosed casing 51. FIG. 4 shows an embodiment where the phase change material inlet 53A is provided at the upper body 53. The phase change material inlet 53A may be shielded by the lid 53B after the phase change material 55 is filled. The lid 53B may be bonded to the upper body 53 by welding, an adhesive, or the like, and thus the inside of the heat transfer case 51 may be sealed.

Hereinafter, an operation of the present embodiment will be described.

First, the control module 95 controls the thermoelectric element 4 and the fan 7.

The temperature controlled container may further include a temperature sensor (not illustrated) which measures the temperature of the first heat transfer body 5.

The control module 95 controls each of the thermoelectric element 4 and the fan 7 according to the cooling mode or the heating mode, and the desired temperature, which are inputted through the controller 96, and the temperature sensed by the temperature sensor.

The control module 95 turns the thermoelectric element 4 and the fan 7 on and off.

The control module 95 varies the temperature of the storage space S1 by varying the voltage applied to the thermoelectric element 4 when the thermoelectric element 4 is turned on.

The control module 95 turns on and off the thermoelectric element 4 and the fan 7 according to the temperature sensed by the temperature sensor and the target temperature in the cooling mode or the heating mode.

Here, the target temperature may be determined according to the desired temperature inputted through the controller 96.

Hereinafter, the cooling mode will be described in detail.

In the cooling mode, the control module 95 turns on the thermoelectric element 4 and the fan 7, respectively, when the temperature sensed by the temperature sensor is above the target temperature.

As described above, when the thermoelectric element 4 and the fan 7 are turned on, the first heat transfer body 5 transfers the heat transferred from the storage space S1 to the thermoelectric element 4 while storing the heat. The second heat transfer body 6 dissipates the heat transferred from the thermoelectric element 4.

During the above-described control, the heat of the storage space S1 is stored in the phase change material 55, and the heat is dissipated through the second heat transfer body 6 so that the heat of the storage space S1 may be quickly lowered.

In the cooling mode, the control module 95 turns off the thermoelectric element 4 and the fan 7, respectively, when the temperature sensed by the temperature sensor is below the target temperature.

Hereinafter, the heating mode will be described in detail.

In the heating mode, the control module 95 turns on the thermoelectric element 4 and the fan 7 when the temperature sensed by the temperature sensor is below the target temperature.

When the thermoelectric element 4 and the fan 7 are turned on as described above, the heat of the thermoelectric element 4 transfers to the first heat transfer body 5 and the heat which is transferred from the thermoelectric element 4 to the first heat transfer body 5 can be stored in the phase change material 55, be dissipated to the storage space S1, and the temperature of the storage space S1 may increase.

In the heating mode, the control module 95 turns off the thermoelectric element 4 and the fan 7 when the temperature sensed by the temperature sensor is equal to or higher than the target temperature.

As described above, when the thermoelectric element 4 and the fan 7 are turned off, the heat stored in the first heat transfer body 5 transfers to the storage space S1, and in the storage space S1, an appropriate temperature may be maintained for a predetermined period of time without abrupt temperature change while the thermoelectric element 4 and the fan 7 are turned off.

Figure 6:
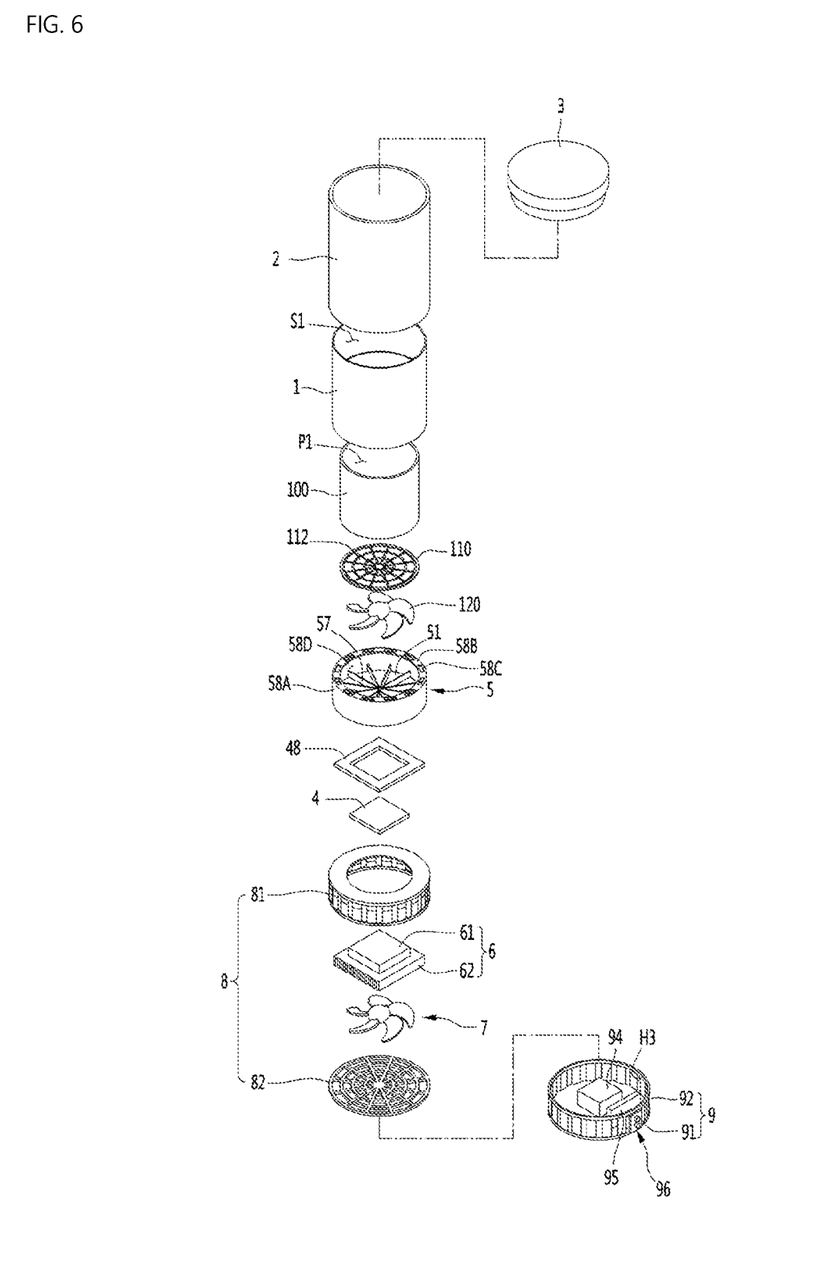
FIG. 6 is an exploded perspective view illustrating a temperature controlled container according to another embodiment of the present invention.
Figure 7:
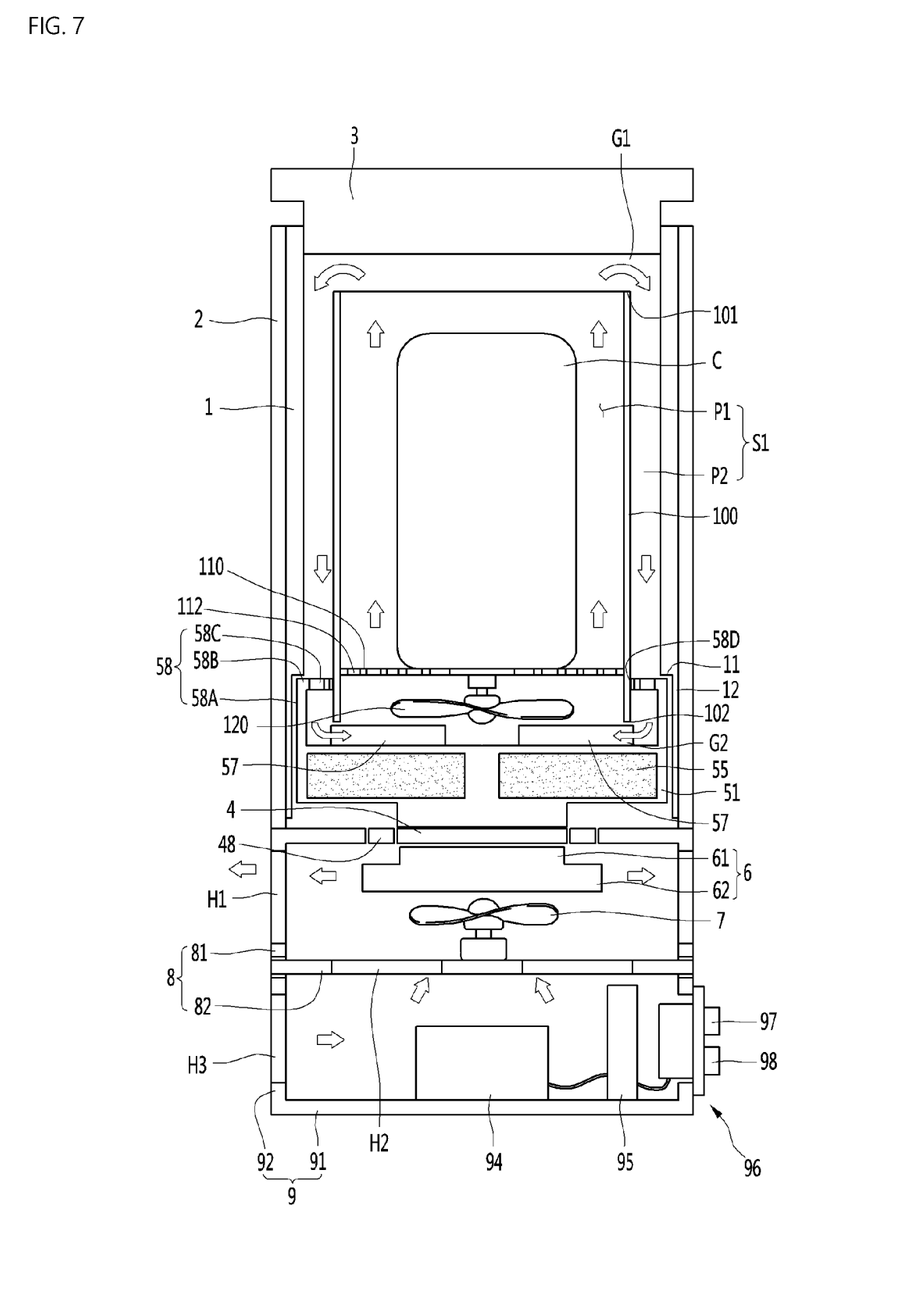
FIG. 7 is a longitudinal-sectional view illustrating the temperature controlled container according to another embodiment of the present invention.

FIG. 6 is an exploded perspective view illustrating a temperature controlled container according to another embodiment of the present invention, and FIG. 7 is a longitudinal sectional view illustrating a temperature controlled container according to another embodiment of the present invention.

The present embodiment may further include a flow path body 100 which forms a flow path in which air is circulated in the cases 1 and 2.

The present embodiment may be an indirect cooling type cooling container which cools the inside of the case 1 and may be an indirect heating type heating container for heating the inside of the case 1, by the air circulating inside the cases 1 and 2.

The flow path body 100 may be disposed in the cases 1 and 2. The flow path body 100 may be disposed in the cases 1 and 2, and in particular, the flow path body 100 may partition the storage space S1. That is, an inner path P1 is formed on an inner side of the flow path body 100, and an outer path P2 is formed on an outer side of the flow path body 100.

The inner path P1 may be a region formed by an inner circumferential surface of the flow path body 100 and the outer path P2 may be a region which is formed between an outer circumferential surface of the flow path body 100 and an inner circumferential surface of the cases 1 and 2.

The flow path body 100 may be spaced apart from the inner circumferential surface of the inner case 1. The outer path P2 through which air passes may be formed Between the outer circumferential surface of the flow path body 100 and the inner circumferential surface of the inner case 1.

The inner path P1 may be an object accommodation space in which the object C is inserted and accommodated.

The outer path P2 may be formed to circulate the air inside the storage space S1. The outer path P2 may function as the object accommodation space together with the inner path P1.

The flow path body 100 may be arranged so that air may be circulated through the inner path P1 and the outer path P2 and performs heat exchange with the heat transfer case 51.

The upper end 101 of the flow path body 100 may be spaced apart from the cap 3 and an upper gap G1 through which air may pass may be formed between the upper end 101 of the flow path body 100 and the cap 3. The upper gap G1 may be an upper connection path connecting the upper portion of the inner path P1 and the upper portion of the outer path P2.

The lower end 102 of the flow path body 100 may be spaced apart from the heat transfer case 51 and a lower gap G2 through which air may pass may be formed between the lower end 102 of the flow path body 100 and the heat transfer case 51. The lower gap G2 may be a lower connection path which connects the lower portion of the inner path P1 and the lower portion of the outer path P2.

The flow path body 100 may be a hollow cylindrical member separated from the cap 3 and the heat transfer case 51, respectively.

The air in the inner path P1 may flow into the inner path P1 after sequentially passing through the upper gap G1, the outer path P2 and the lower gap G2, and conversely, may flow into the inner path P1 after sequentially passing through the lower gap G2, the outer path P2, and the upper gap G1.

The flow path body 100 may three-dimensionally form the upward air flow and the downward air flow in the storage space S1.

The temperature controlled container may further include a circulation fan cover 110 and a circulation fan 120.

The circulation fan cover 110 may be a cover which protects the circulation fan 120. The circulation fan cover 110 may be provided with an inner through-hole 112 through which the air passes.

A plurality of inner through-holes 112 may be formed in the circulation fan cover 110 and the inner through-holes 112 may be formed to face the circulation fan 120 and the inner path P1. The inner through-holes 112 may be positioned between the circulation fan 120 and the inner path P1 and may be communication holes through which air flowing by the circulation fan 120 passes in the up and down direction.

The circulation fan cover 110 may be disposed at the lower end of the flow path body 100 or may be disposed in the flow path body 100. The circulation fan cover 110 may be an object placing body on which the object C may be placed and may serve as a support portion which supports the object C.

The circulation fan cover 110 may be disposed in the flow path body 100 and may function as a division body which divides the inside of the flow path body 100 upward and downward. In this case, the circulation fan cover 110 may divide the inside of the flow path body 100 into an object accommodation space in which the object C is accommodated and a circulation fan accommodation space in which the circulation fan 120 is accommodated.

As described above, in a case where the circulation fan cover 110 is disposed in the flow path body 100, the circulation fan 120 may be disposed inside the flow path body 100. In this case, the circulation fan 120 may be surrounded by the inner circumferential surface of the flow path body 100, and the flow path body 100 may also function as a fan housing surrounding the outer circumference of the circulation fan 120.

The circulation fan cover 110 may be disposed in the flow path body 100 so as to be spaced apart from an outer fin 57 to be described later.

A space in which the circulation fan 120 is positioned to be rotatable may be formed between the circulation fan cover 110 and the outer fin 57 and, to this end, a lower end of the circulation fan cover 110 may be spaced apart from an upper end of the outer fin 57.

In a case where the circulation fan cover 110 is disposed in the flow path body 100, the inner through-holes 112 of the circulation fan cover 110 may communicate with the object accommodation space and the circulation fan accommodation space, and the air may flow through the inner through-holes 112 in the circulation fan accommodation space and into the object accommodation space or, conversely, may flow through the inner through-holes 112 in the object accommodation space and into the circulation fan accommodation space.

The circulation fan 120 may be an airflow generating device which forms a circulating air flow in the storage space S1. The circulation fan 120 may be an axial flow fan that causes air to flow in the axial direction. The circulation fan 120 may include a motor and a fan connected to the rotational axis of the motor, and the motor may be mounted on the circulation fan cover 110.

The circulation fan 120 may be disposed between the circulation fan cover 110 and the heat transfer case 51 and may be, particularly, disposed between the circulation fan cover 110 and the outer fin 57.

When the circulation fan 120 is driven, the air flows along an upper surface of the heat transfer case 51 and may perform heat exchange with the upper surface of the heat transfer case 51 and the outer fin 57.

The temperature controlled container may include at least one outer fin 57 for promoting the heat transfer of the first heat transfer body 5. The outer fin 57 is preferably formed in the heat transfer case 51 to promote the heat transfer of the heat transfer case 51.

The outer fin 57 may be formed on the upper surface of the heat transfer case 51 and may perform heat exchange with the flowing air caused by the circulation fan 120. The outer fin 57 may have a long wall shape in the horizontal direction. The outer fin 57 may protrude from the upper surface of the heat transfer case 51 toward the circulation fan 120. The outer fin 57 may protrude upright in the vertical direction.

A plurality of outer fins 57 may be formed on the upper surface of the heat transfer case 51. The plurality of outer fins 57 may be radially disposed on the upper surface of the heat transfer case 51. The plurality of outer fins 57 may be spaced apart from the upper surface of the heat transfer case 51 in the circumferential direction.

The temperature controlled container may further include an air guide 58 surrounding the outer fin 57. The air guide 58 may guide the air circulating in the storage space S1 so as to be guided to the outer fin 57.

The air guide 58 may be provided with outer through-holes 58C facing the outer path P2. The air in the outer path P2 may flow into the air guide 58 through the outer through-holes 58C and performs heat exchange with the outer fin 57 in the air guide 58.

A plurality of outer through-holes 58C may be formed in the air guide 58. The plurality of outer through-holes 58C may be spaced along the circumferential direction of the air guide 58.

The air guide 58 may be formed separately from the first heat transfer body 5, coupled to the first heat transfer body 5, and be integrally formed with the first heat transfer body 5.

The air guide 58 may be disposed on the upper portion of the heat transfer case 51 and may surround the outer fin 57 formed on the upper surface of the heat transfer case 51.

The air guide 58 may include an outer air guide 58A and an upper air guide 58B.

The outer air guide 58A may protrude from the upper portion of the heat transfer case 51 in a hollow shape. A space may be formed in the outer air guide 58A. The space formed inside the outer air guide 58A may be a space which accommodates the outer fin 57 protruding from the upper surface of the heat transfer case 51 and may be a path through which the air passes.

The upper air guide 58B may be formed on an upper portion of the outer air guide 58A. The outer through-hole 58C may be formed in the upper air guide 58B and the upper air guide 58B may prevent foreign matter such as dust from being directed to the outer fin 57.

The air guide 58 may be disposed such that the outer circumference thereof faces the inner circumferential surface of the inner case 1.

In one embodiment, the outer air guide 58A may be disposed adjacent or in close contact with the inner circumferential surface of the inner case 1 and, in this case, the outer through-hole 58C may be formed to be opened on the upper air guide 58B in the up and down direction. In this case, the upper end of the air guide 58 may be restricted upwardly on the stopper 11 of the inner case 1, and the outer circumferential surface of the air guide 58 may in contact with the contact surface 12 of the inner case 1 together with the outer circumferential surface of the heat transfer case 51.

In another embodiment, the outer air guide 58A may be disposed so as to be spaced apart from the inner circumferential surface of the inner case 1 and, in this case, the outer through-hole 58C is formed to be opened on the upper air guide 58B in the up and down direction and may be formed to be opened horizontally to the outer air guide 58A. In this case, the gap between the outer circumferential surface of the outer air guide 58A and the inner circumferential surface of the inner case 1 may communicate with the outer path P2 in the up and down direction, and the air in the outer path P2 may pass through the outer through-hole 58C after passing through the gap between the outer circumferential surface of the outer air guide 58A and the inner circumferential surface of the inner case 1 and may flow into the inside of the air guide 58.

The air guide 58, in particular, the outer air guide 58A may help in mutual heat transfer between the heat transfer case 51 and the inner case 1. In other words, the air guide 58 may have a function of protecting the outer fin 57 and a function of fixing the flow path body 100, as well as a function of promoting heat transfer.

The lower portion of the flow path body 100 may be inserted into the air guide 58 and, in this case, a flow path body insertion hole 58D may be formed in the air guide 58.

The lower end 102 of the flow path body 100 may be inserted into the space inside the air guide 58 through the flow path body insertion hole 58D.

The lower end 102 of the flow path body 100 may be raised up to the outer fin 57 in the space of the air guide 58. In a case where the lower end 102 of the flow path body 100 is raised on the upper end of the outer fin 57 and in a case of being in contact with the upper end of the outer fin 57, the flow path body 100 and the outer fin 57 may perform direct heat-transfer and the flow path body 100 may be heated or cooled more quickly by the outer fin 57.

The flow path body insertion hole 58D may be formed to pass through the air guide 58, particularly, the upper air guide 58B in the up and down direction.

The diameter of the flow path body insertion hole 58D may be equal to or slightly larger than the outer diameter of the flow path body 100. The inner circumference of the upper air guide 58B may be in contact with the outer circumferential surface of the flow path body 100 and the upper air guide 58B may fix to the lower portion of the flow path body 100. In this case, the air guide 58 may be a flow path body supporter which supports the flow path body 100 so that the flow path body 100 does not shake or roll over.

The flow path body 100 may be supported by at least one of the outer fin 57 and the air guide 58.

Meanwhile, in a case where the flow path body insertion hole 58D is formed in the air guide 58 as described above, the outer through-hole 58C may be formed on the outer side of the flow path body insertion hole 58D.

Since the present embodiment is same or similar to the previous embodiment except for the flow path body 100, the circulation fan cover 110, the circulation fan 120, the outer fin 57, and the air guide 58, the same reference numerals are used, and a detailed description thereof will be omitted.

Hereinafter, the operation of the present embodiment will be described.

First, the control module 95 controls the thermoelectric element 4, the fan 7, and the circulation fan 120.

The temperature controlled container may further include a temperature sensor (not illustrated) which measures the temperature of the first heat transfer body 5.

The control module 95 controls the thermoelectric elements 4, the fans 7, and the circulation fans 120, respectively, according to the cooling mode and the heating mode, and the desired temperature, which are inputted through the controller 96, and the temperature sensed by the temperature sensor.

The control module 95 varies the temperature of the storage space S1 by varying the voltage applied to the thermoelectric element 4.

The control module 95 varies the temperature of the storage space S1 by varying the voltage applied to the circulation fan 120. In this case, the control module 95 turns on the circulation fan 120 at high voltage or at low voltage by turning on and off the thermoelectric element 4 and the fan 7.

The control module 95 turns on and off the thermoelectric element 4 and the fan 7 according to the temperature sensed by the temperature sensor and the target temperature in the cooling mode and the heating mode, and, according to the sensed temperature by the temperature sensor and the target temperature, the circulation fan 120 is turned on at the high voltage or at the low voltage.

Here, the target temperature may be determined according to the desired temperature inputted through the controller 96.

Hereinafter, the cooling mode will be described in detail.

In the cooling mode, the control module 95 turns on each of the thermoelectric element 4 and the fan 7 and turns on the circulation fan 120 at the high voltage when the temperature sensed by the temperature sensor is higher than the target temperature.

When the thermoelectric element 4 and the fan 7 turn on and the circulation fan 120 turns on at the high voltage as described above, the air in the storage space S1 rapidly flows and the heat of the storage space S1 is transferred to the first heat transfer body 5 and the first heat transfer body 5 transfers the heat transferred from the storage space S1 to the thermoelectric element 4 while storing the heat, and the second heat transfer body 6 dissipates the heat transferred from the thermoelectric element 4.

During the above-described control, since the heat of the storage space S1 is stored in the phase change material 55, and the heat is dissipated through the second heat transfer body 6, the heat of the storage space may be quickly lowered.

In the cooling mode, the control module 95 turns off the thermoelectric element 4 and the fan 7, respectively, and turn on the circulation fan 120 at the low voltage, when the temperature sensed by the temperature sensor is below the target temperature.

As described above, when the thermoelectric element 4 and the fan 7 turn off and the circulation fan 120 turns on at the low voltage, the air in the storage space S1 flows slowly, and the heat of the storage space S1 may be transferred to the first heat transfer body 5 and this heat may be stored in the phase change material 55 and the storage space S1 may be kept cool while the thermoelectric element 4 turns off. During controlling described above, the heat of the storage space S1 is slowly stored in the phase change material 55 and the storage space S1 may be maintained at an appropriate temperature for a determined period of time without a large temperature change while the thermoelectric element 4 and the fan 7 are turned off.

Hereinafter, the heating mode will be described in detail.

In the heating mode, the control module 95 turns on the thermoelectric element 4 and the fan 7 and turns on the circulation fan 120 at the high voltage when the temperature sensed by the temperature sensor is the target temperature or less.

When the thermoelectric element 4 and the fan 7 turn on and the circulation fan 120 turns on at the high voltage as described above, the heat of the thermoelectric element 4 may be transferred to the first heat transfer body 5. The heat transferred to the first heat transfer body 5 from the thermoelectric element 4 may be stored in the phase change material 55 and may be dissipated into the storage space S1.

The air in the storage space S1 may rapidly flow caused by the circulation fan 120 to transfer the heat of the first heat transfer body 5 to the storage space S1 and the temperature of the storage space S1 may rapidly increase.

In the heating mode, the control module 95 turn off the thermoelectric element 4 and the fan 7 and turns off the circulation fan 120 at the low voltage when the temperature sensed by the temperature sensor is the target temperature or more.

As described above, when the thermoelectric element 4 and the fan 7 turn off and the circulation fan 120 turns on at the low voltage, the air in the storage space S1 may transfer the heat stored in the first heat transfer body 5 to the storage space S1 while flowing slowly and the storage space S1 may be maintained at an appropriate temperature for a predetermined period of time without abrupt temperature change while the thermoelectric element 4 and the fan 7 are turned off.

The description is merely illustrative of the technical idea of the present invention, and various modifications and changes may be made by those skilled in the art without departing from the essential characteristics of the present invention.

Therefore, the embodiments disclosed in the present invention are not intended to limit the scope of the present invention but to describe the present invention, and the scope of the technical idea of the present invention is not limited by the embodiments.

The scope of protection of the present invention should be construed according to the following claims, and all technical ideas within the scope of equivalents thereof should be construed as being included in the scope of the present invention.

What is claimed is:

1. A temperature controlled container comprising:
a case including a storage space formed therein;
a thermoelectric element;
a heat transfer case including:
an enclosed space formed therein and is wider than the thermoelectric element;
a contact body portion that is in contact with the thermoelectric element; and
a non-contact body portion that is not in contact with the thermoelectric element;
a phase change material accommodated in the enclosed space; and
a plurality of heat transfer bodies disposed in the enclosed space of the heat transfer case, each of the plurality of heat transfer bodies including a first body portion in communication with the contact body portion and a second body portion in communication with the non-contact body portion,
wherein the first body portion is in communication with the second body portion,
wherein each of the plurality of heat transfer bodies is disposed radially in the enclosed space extending from a center of the enclosed space to a connection end of-the heat transfer case,
wherein the plurality of heat transfer bodies partition the enclosed space into a plurality of unit spaces, and the phase change material is accommodated in each of the plurality of unit spaces;
wherein the heat transfer case further includes:
an upper body including an upper surface facing the storage space,
a lower body including the contact body portion and the non-contact body portion; and a connection body that connects the lower body and the upper body;

wherein the plurality of heat transfer bodies is connected to a center core formed at the center of the enclosed space; and wherein the second body portion includes the connection end that is connected to the connection body.

2. The temperature controlled container according to claim 1, wherein each of the plurality of heat transfer bodies includes a wall including:

a length extending from the center of the enclosed space of the heat transfer case to the connection body; and a height extending from the lower body to the upper body.

3. The temperature controlled container according to claim 1, wherein the case includes:

an outer case; and an inner case disposed in the outer case and including the storage space therein, the inner case including:

a stopper that restricts the heat transfer case from moving in an upward direction beyond the stopper; and a contact surface that is in contact with the heat transfer case.

4. The temperature controlled container according to claim 1, further comprising:

a cap that opens and closes the storage space;

a flow path body disposed in the case and partitions the storage space into an inner path on an inner side and an outer path on an outer side of the flow path body;

a circulation fan cover disposed in the flow path body and including an inner through-hole through which air passes; and a circulation fan disposed between the circulation fan cover and the heat transfer case.

5. The temperature controlled container according to claim 4, wherein the first heat transfer body further includes an outer fin formed on an upper surface of the heat transfer case to perform heat exchange with flowing air caused by the circulation fan.

6. The temperature controlled container according to claim 5, wherein the outer fin protrudes from the upper surface of the heat transfer case toward the circulation fan.

7. The temperature controlled container according to claim 5, wherein the flow path body is in contact with the outer fin.

8. The temperature controlled container according to claim 5, wherein The flow path body is a hollow cylinder with an upper end spaced apart from the cap and a lower end spaced apart from the heat transfer case, and the circulation fan cover is disposed in the flow path body so as to be spaced apart from the outer fin.

9. The temperature controlled container according to claim 5, further comprising:

an air guide disposed on an upper portion of the heat transfer case so as to surround the outer fin, and the air guide includes an outer through-hole facing the outer path.

10. The temperature controlled container according to claim 9, wherein the air guide includes an outer air guide disposed so as to protrude in a hollow shape at the upper portion of the heat transfer case and including a space therein; and an upper air guide formed on an upper portion of the outer air guide and in which the outer through-hole is formed.

11. The temperature controlled container according to claim 10, wherein the outer through-hole is formed outside the flow path body insertion hole.

12. The temperature controlled container according to claim 9, wherein the air guide includes a flow path body insertion hole into which a lower portion of the flow path body is inserted.

13. The temperature controlled container according to claim 4, wherein the flow path body is a hollow cylinder with an upper end spaced apart from the cap and a lower end spaced apart from the heat transfer case, and the circulation fan cover is disposed in the flow path body so as to be spaced apart from the heat transfer case.

14. The temperature controlled container according to claim 4, further comprising:

an air guide disposed on an upper portion of the heat transfer case, in which a flow path body insertion hole into which a lower portion of the flow path body is inserted is formed, and which includes an outer through-hole facing the outer path.

15. The temperature controlled container according to claim 14, wherein the air guide includes an outer air guide including a space therein; and an upper air guide formed on an upper portion of the outer air guide and in which the outer through-hole is formed.

16. The temperature controlled container according to claim 14, wherein the case includes an outer case, and an inner case disposed in the outer case and including the storage space therein, the inner case including a stopper that restricts the air guide from moving in an upward direction beyond the stopper, and the inner case includes a contact surface with which the air guide is in surface contact.

17. The temperature controlled container according to claim 1, further comprising:

a removable base disposed under the case including a battery;

a fan cover disposed on the removable base; and a fan disposed in the fan cover to blow air, wherein the fan cover includes:

an outer cover that surrounds a circumference of the fan; and a lower cover formed under the outer cover and positioned under the fan, each of the outer cover and the lower cover including a through-hole configured to pass air.

* * * * *